United States Patent [19]

MacDonald et al.

[11] Patent Number: 5,640,133

[45] Date of Patent: Jun. 17, 1997

[54] CAPACITANCE BASED TUNABLE MICROMECHANICAL RESONATORS

[75] Inventors: Noel C. MacDonald; Fred M. Bertsch; Kevin A. Shaw; Scott G. Adams, all of Ithaca, N.Y.

[73] Assignee: Cornell Research Foundation, Inc., Ithaca, N.Y.

[21] Appl. No.: 494,024

[22] Filed: Jun. 23, 1995

[51] Int. Cl.$^6$ ................................................ H03H 9/205
[52] U.S. Cl. .................... 333/197; 333/186; 333/191; 361/278; 361/283.1; 361/287
[58] Field of Search ........................... 333/186, 187–192, 333/219; 361/278, 283.1, 287

[56] References Cited

U.S. PATENT DOCUMENTS

| | | |
|---|---|---|
| 3,498,138 | 3/1970 | Stewart . |
| 3,672,985 | 6/1972 | Nathanson et al. . |
| 3,835,338 | 9/1974 | Martin . |
| 4,381,672 | 5/1983 | O'Connor et al. . |
| 4,437,226 | 3/1984 | Soclof . |
| 4,472,239 | 9/1984 | Johnson et al. . |
| 4,483,194 | 11/1984 | Rudolf . |
| 4,522,682 | 6/1985 | Soclof . |
| 4,553,436 | 11/1985 | Hanssen . |
| 4,653,326 | 3/1987 | Danel . |
| 4,670,092 | 6/1987 | Motamedi . |
| 4,682,503 | 7/1987 | Higashi et al. . |
| 4,685,198 | 8/1987 | Kawakita et al. . |
| 4,706,374 | 11/1987 | Murakami . |
| 4,711,128 | 12/1987 | Boura . |
| 4,736,629 | 4/1988 | Cole . |
| 4,740,410 | 4/1988 | Muller et al. . |
| 4,746,621 | 5/1988 | Thomas et al. . |
| 4,750,363 | 6/1988 | Norling ........................... 73/517 R |
| 4,772,928 | 9/1988 | Dietrich et al. . |
| 4,776,924 | 10/1988 | Delapierre . |
| 4,783,237 | 11/1988 | Aine et al. . |
| 4,783,821 | 11/1988 | Muller et al. . |
| 4,845,048 | 7/1989 | Tamaki et al. . |
| 4,851,080 | 7/1989 | Howe et al. . |
| 4,853,348 | 8/1989 | Tsubouchi et al. . |
| 4,867,842 | 9/1989 | Bohrer et al. . |
| 4,945,765 | 8/1990 | Roszhart . |
| 4,980,317 | 12/1990 | Koblinger et al. . |
| 4,981,552 | 1/1991 | Mikkor . |

(List continued on next page.)

FOREIGN PATENT DOCUMENTS

| | | |
|---|---|---|
| 62-232171 | 12/1987 | Japan . |
| 63136982 | 9/1988 | Japan . |
| 58-89859 | 2/1994 | Japan . |

OTHER PUBLICATIONS

Core et al., "Fabrication Technology for an Integrated Surface–Mechanical Sensor", Solid State Technology, Oct. 1993, pp. 39–47 Oct. 93.

Kubota et al., "New SOI CMOS Process with Selective Oxidation", IDEM 86, pp. 814–816 1986.

Tang, et al; "Laterally Driven Polysilicon Resonant Microstructures, Sensors and Actuators," 20 (1989) pp. 25–32 no month.

Wilson, et al; "Highly Selective, High Rate Tungsten Deposition," Materials Research Society, 1985, pp. 35–43 no month.

(List continued on next page.)

*Primary Examiner*—Benny Lee
*Assistant Examiner*—Darius Gambino
*Attorney, Agent, or Firm*—Jones, Tullar & Cooper, P.C.

[57] ABSTRACT

A tunable electromicromechanical resonator structure incorporates an electrostatic actuator which permits reduction or enhancement of the resonant frequency of the structure. The actuator consists of two sets of opposed electrode fingers, each set having a multiplicity of spaced, parallel fingers. One set is mounted on a movable portion of the resonator structure and one set is mounted on an adjacent fixed base on substrate, with the fingers in opposed relationship and their adjacent ends spaced apart by a gap. An adjustable bias voltage across the sets of electrodes adjusts the resonant frequency of the movable structure.

18 Claims, 6 Drawing Sheets

U.S. PATENT DOCUMENTS

| | | |
|---|---|---|
| 5,025,346 | 6/1991 | Tang et al. .............................. 361/283.1 |
| 5,121,180 | 6/1992 | Beringhause . |
| 5,126,812 | 6/1992 | Greiff . |
| 5,149,673 | 9/1992 | MacDonald et al. . |
| 5,175,521 | 12/1992 | Larson . |
| 5,179,499 | 1/1993 | MacDonald et al. . |
| 5,198,390 | 3/1993 | MacDonald et al. . |
| 5,205,171 | 4/1993 | O'Brien et al. . |
| 5,228,341 | 7/1993 | Tsuchitani ............................ 73/517 R |
| 5,235,187 | 8/1993 | Arney et al. . |
| 5,249,465 | 10/1993 | Bennett . |
| 5,314,572 | 5/1994 | Core . |
| 5,345,824 | 9/1994 | Sherman . |
| 5,353,641 | 10/1994 | Tang . |
| 5,357,803 | 10/1994 | Lane . |
| 5,375,033 | 12/1994 | MacDonald . |
| 5,399,415 | 3/1995 | Chen . |
| 5,449,903 | 9/1995 | Arney et al. . |
| 5,455,547 | 10/1995 | Lin et al. ................................. 333/186 |
| 5,491,604 | 2/1996 | Nguyen et al. ......................... 333/197 |
| 5,537,083 | 7/1996 | Lin et al. ................................. 333/186 |
| 5,045,152 | 9/1991 | Sickafus . |
| 5,068,203 | 11/1991 | Logsdon et al. . |
| 5,072,288 | 12/1991 | MacDonald et al. . |
| 5,095,752 | 3/1992 | Suzuki et al. . |

OTHER PUBLICATIONS

Zhang, et al; "An RIE Process for Submicron, Silicon Electromechanical Structures," IEEE, May 24, 1991, pp. 520–523.

Arney, et al; "Formation of Submicron Silicon–on–Insulator Structures by Lateral Oxidation of Substrate Silicon Islands," J.Vac.Sci.Technol. B 6(1), Jan./Feb. 1988, pp. 341–345.

Lutze, et al; "Anisotropic Reactive Ion Etching of Aluminum Using $Cl_2$, $BCl_3$, and $CH_4$ Gases", J. Electrochem. Soc.vol. 137, No. 1, Jan. 1990 pp. 249–252.

Mele, et al; "Anistotropic Reactive Ion Etching of $MoSi_2$ and In Situ Doped n+ and p+ Polysilicon Using $Cl_2$ and $BCL_3$" J.Electrochem. Soc.: Solid–State Science and Technology, Sep. 1988 pp. 2373–2378.

Yao, et al; "Fabrication of High Frequency Two–Dimensional Nanoactuators for Scanned Probe Devices;" Journal of Microelectromechanical Systems; vol. 1; No. 1; Mar. 1992; pp. 14–22.

Yao, et al; "Nanostructures in Motion;" Nanostructures and Mesoscopic Systems; Wiley P. Kirk and Mark Reed; Eds. Academic Press; Dec. 1991; pp. 1–9.

Zhang, et al; "A RIE Process for Submicron, Silicon Electromechanical Structures," IOP Publishing Ltd., 1992 pp. 31–38 no month.

Payne, et al; "Surface Micromachined Accelerometer: A Technology Update," SAE International Congress and Exposition, Feb. 25–Mar. 1, 1991, pp. 127–135.

Goodenough, "Airbags Boom When IC Accelerometer Sees 50 G," Electronic Design, Aug. 8, 1991, pp. 45–56.

Woodson, et al; "Electromechanical Dynamics Part III: Elastic and Fluid Media," Introduction to the Electromechanics of Elastic Media, 1985 pp. 704–707 no month.

Lin, et al; "Micro Electromechanical Filters for Signal Processing," Micro Electro Mechanical Systems '92, Travemunde (Germany), Feb. 4–7, 1992, pp. 226–231.

CAPACITANCE BASED TUNABLE MICROMECHANICAL RESONATORS

BACKGROUND OF THE INVENTION

The present invention relates, in general, to mechanical resonators, and more particularly to tunable micromechanical devices wherein the resonant frequency of oscillators and resonators can be selectively increased and decreased.

In the field of electromechanical filters, high Q mechanical resonators are used to pass frequencies very close to the resonant frequency of the mechanical structure. Pass band filters can be constructed using resonators in parallel, where the resonant frequencies of two or more resonators are close together. However, even apparently identical micromechanical devices such as oscillators or resonators have variations in their resonant frequencies, even when they are fabricated on the same die, because of differences in materials dimensions, and the like from one device to the next, and due to drift over a period of time. This inhibits the reproduceability and the quality of such devices, and results in the need for a method or structure for tuning their resonant frequencies quickly, easily, and reliably.

Pass band filters have been constructed which utilize a series of resonators in parallel, but techniques for adjusting their resonant frequencies require the use of processes such as laser trimming and selective deposition (see "Microelectromechanical Filters for Signal Processing," Liwei Lin et al, proceedings IEEE Microelectromechanical Systems (Travemunde, Germany) February 1992, pages 226–231. See also *Electromechanical Dynamics part III: Elastic and Fluid Media*, Herbert H. Woodson et al, Robert E. Kreger Publishing Co., 1985, pages 704–707). Such techniques have not been entirely satisfactory. In addition, previous work on the theory of electrostatic tuning actuators and their associated nonlinearities has been done, but such work only addresses resonant frequency reduction, not augmentation.

SUMMARY OF THE INVENTION

The present invention is directed to electrostatic actuators which provide a mechanism for electromechanically increasing or decreasing the stiffness and thus the resonant frequency of mechanical oscillators, resonators, accelerometers, electromechanical filters and the like. The mechanism is easily included in an accelerometer or other device design not only to compensate for variations that can occur in the fabrication process, but also to permit adjustments of device sensitivity or to selectively vary the resonant frequency to achieve a desired frequency response range. More particularly, the present invention utilizes electrostatic actuators for electromechanical filter devices which incorporate selective stiffness augmentation and reduction to allow selective tuning of such devices.

Briefly, the tunable micromechanical resonator of the present invention is directed to devices such as oscillators, accelerometers, filters, or the like which are mounted or supported for relative motion with respect to, for example, a substrate, and which, when driven by an external force, have a resonant frequency. Such devices may herein be referred to as resonators or micromechanical resonators. Such devices, in accordance with the invention, are tuned by means of actuators which electromechanically alter the stiffness of the resonator device and thus alter its resonant frequency.

The resonator of the invention includes a movable released structure which may, in the preferred embodiment, be in the form of an elongated beam fabricated from single crystal silicon. The resonator is fabricated using a single mask process such as that described and illustrated in U.S. patent application Ser. No. 08/312,797, entitled "Microstructures and Single Mask, Single-Crystal Process for Fabrication Thereof," of Kevin A. Shaw, Z. Lisa Zhang and Noel C. MacDonald, filed Sep. 27, 1994, (Docket CRF D-1307C) the disclosure of which is incorporated herein by reference. That application describes a single-mask, low temperature, self-aligned process for the fabrication of microelectromechanical (MEM) structures, which may be referred to as the SCREAM-I process (single crystal reactive etch and metal). It is a dry bulk micromachining process which uses reactive ion etching to both define and release structures of arbitrary shape and to provide defined metal surfaces on the released structure as well as on stationary interconnects, pads and the like. Structures having widths in the range of 0.5 micrometers to 5 micrometers, with structural depth (or height) of between about 10 and 20 micrometers can be fabricated using this process, with all the structural elements, including movable elements such as beams and stationary elements such as interconnects, beams and contact pads defined with a single mask so that metal contacts can be applied to the structure in a self-aligned manner.

In the SCREAM-I process, deep isolating trenches are formed completely around defined structures. Thereafter, the structures are undercut to selectively release them and to produce cavities at the bases of surrounding mesas. Thereafter exposed surfaces are metalized. The undercutting and the formation of cavities at the bases of surrounding mesas serve to break the continuity of the deposited metal, thereby electrically isolating the metal on released structures and on defined mesas from the metal on the bottom of the trenches. A dielectric layer isolates the metal from the underlying substrate. The elements defined by the trenches are interconnected by the metal layer so that released structures can be electrically connected through the metal layer to pads in the surrounding mesas. Interconnects are provided in selected locations, with the interconnects and pads also being defined by the trenches. Thus, with only a single mask, defined high-aspect-ratio, free-standing or released single-crystal silicon structures coated with silicon dioxide and aluminum are produced. The outer coating of aluminum forms electrodes which are used in the present invention as electrostatic actuators, as will be described.

In its simplest form, the resonator of the present invention consists of a mechanically movable component which is suspended for motion with respect to a substrate. This component, which may be a released MEM elongated beam fabricated from the substrate, for example, is suspended by suitable flexible supports such as laterally extending flexible arms which mount the movable component to the adjacent substrate and constrain it to motion along a selected path, such as the axis of the component. These flexible support arms act as springs, while the movable component acts as a mass which may be used to sense acceleration, may be used as a mechanical resonator, or oscillator, or for like purposes. The motion of this component may be at a resonant frequency which is dependent upon the mass of the component and the flexibility or stiffness of the spring-type arms.

Tuning of the resonance of the mechanical structure is, in accordance with the present invention, provided by one or more electrostatic actuators which consist of pairs of comblike fingers, each pair consisting of two sets of opposed fingers. One set of a pair is mounted on the mechanically movable component of the resonator for motion with respect to the opposite set, which is mounted so as to be stationary, and thus may be mounted on the adjacent mesa. The sets of fingers in a pair do not overlap or interleave, but are in an end-to-end spaced relationship to form a gap along a path generally parallel to the path of motion of the movable component. Thus, the fingers are mounted to move past each other in end-to-end relationship without contact. A voltage applied across the opposed sets of fingers produces electrostatic force fields in the gap between the ends of the opposed fingers, these forces being in the form of fringing fields at the ends of the opposed fingers. The fringing fields produce actuation forces on the opposed sets of fingers to either increase or reduce the axial motion of the component. These pairs of comb-like fingers may be referred to as actuator comb drives which incorporate finger electrodes capable of being activated by applied voltages. Pairs of comb drives may be positioned at various locations on the mechanically movable component, with the drives being connected electrically to suitable circuitry, preferably on the substrate, for independent, controlled energization. The actuator comb drives control the motion of the component to augment or to reduce its motion to tune the resonant frequency. The actuator may also be energized to drive the structure into motion, depending upon the voltages applied and their frequency.

Comparable results are achievable with a variety of actuator geometries. For example, in addition to the above-described parallel structure where the resonator component moves in a path parallel to the actuator gap, comb drives can be mounted for motion of the opposed sets of electrodes perpendicular to the gap; i.e., toward and away from each other, with an applied voltage across the two sets controlling the force versus deflection characteristics. Even a single pair of parallel plate electrodes exhibits force versus deflection responses that can be used to tune the resonant frequency of an oscillating device. However, the fringing field actuator described above contains a significant number of advantages over others, and is preferred.

BRIEF DESCRIPTION OF THE DRAWINGS

The foregoing, and additional objects, features and advantages of the present invention will be more clearly understood from the following detailed description of preferred embodiments of the present invention, taken in conjunction with the accompanying drawings, in which.

DESCRIPTION OF PREFERRED EMBODIMENTS

Figure 1:
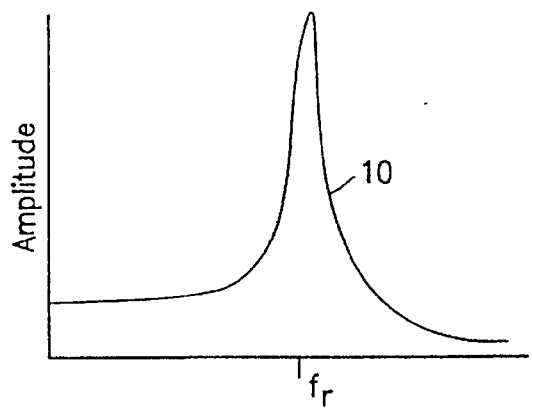
FIG. 1 is a curve illustrating the frequency vs. amplitude characteristics of a simple resonant system.
Figure 2:
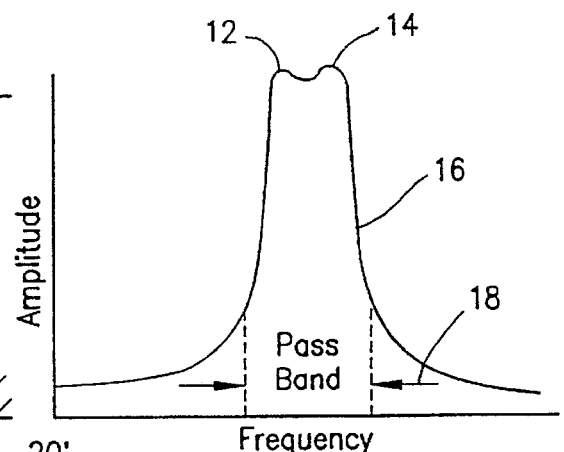
FIG. 2 is a curve which illustrates the frequency vs. amplitude characteristics of a band pass filter using parallel resonators.

As illustrated in FIG. 1, a high Q mechanical resonator produces a frequency versus amplitude curve such as that illustrated at 10, with a peak amplitude occurring at a resonant frequency $f_r$. If two or more resonators are constructed in parallel with their resonant frequencies close together, as illustrated by the peaks 12 and 14 of curve 16 in FIG. 2, the resulting structure has a pass band such as that illustrated at 18. Because the particular resonant frequency or the pass band of a mechanical structure being used as a filter, for example, is extremely important, the ability to tune such devices becomes essential in micromechanical structures where processing variations will significantly impede reproduceability and thus the quality of such devices.

Figures 3, 4:
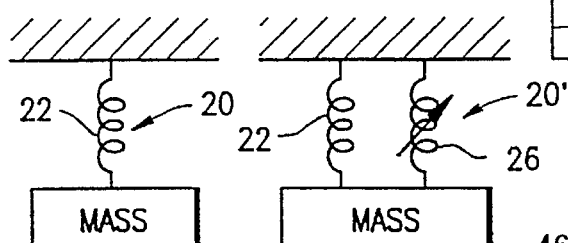
FIG. 3 is a diagram of a simple spring mass resonant system.
FIG. 4 is a diagram of a spring mass system modified by a tuning actuator.

As is well known, a resonant structure can be modeled by a simple spring mass system, such as the system 20 illustrated in FIG. 3, wherein the natural vibration frequency $F_n$ is determined by the formula $$F_n = \frac{1}{2\pi} \sqrt{\frac{K_{system}}{mass}} \qquad \text{(Eq. 1)}$$

where $K_{system}$ is the stiffness of the entire system, which in this case is the mechanical spring 22 having a stiffness $K_{mechanical}$. The system stiffness can be adjusted to alter its natural frequency; in accordance with the present invention, the stiffness of a mechanical system is altered electrically, in the manner illustrated diagrammatically in FIG. 4. Thus, the system 20' includes not only spring 22, but a variable actuator 26 having a stiffness which may be identified as $K_{electrical}$ so that the system 20' has a stiffness which may be identified as:

$$K_{system} = K_{mechanical} + K_{electrical} \qquad \text{(Eq. 2)}$$

Figure 5:
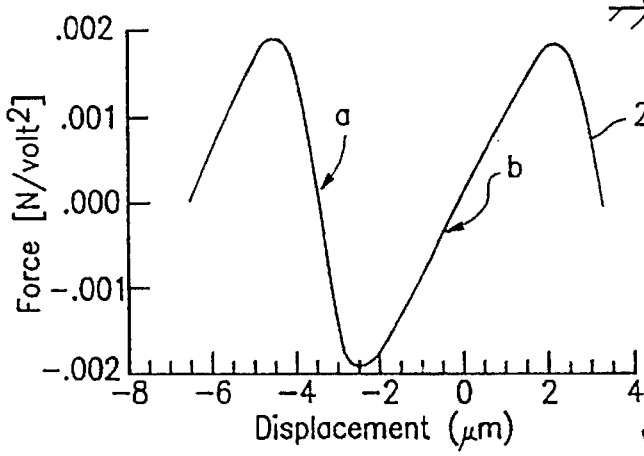
FIG. 5 is a curve which illustrates the force vs. displacement characteristics of a tuning actuator in accordance with the invention.

In order to construct a system that will perform in a manner illustrated in FIG. 4, an electrostatic actuator having a linear force versus deflection response such as that illustrated by curve 28 in FIG. 5 is provided. The tuning actuator has large regions where the forces are predominantly linear with respect to deflection, as indicated in regions "a" and "b." The linear region indicated at "a" may be, for example, representative of linear hardening, or stiffening, while the region "b" represents linear softening, or a reduction of stiffness. This linearity means that the force produced by the electrostatic actuator can be viewed as an electrical spring wherein the magnitude of the spring constant can be altered by varying the voltage applied to it.

Figure 6:
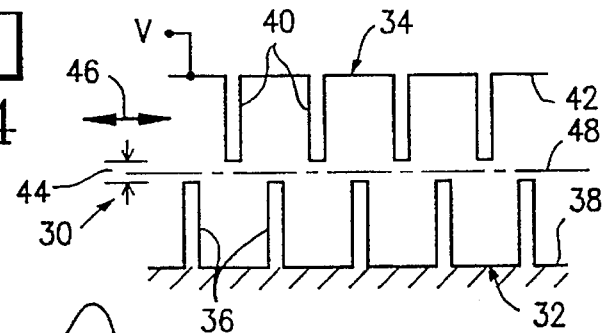
FIG. 6 is a diagrammatic illustration of a comb-type actuator used for stiffness reduction in an electromicromechanical resonator.
Figure 7:
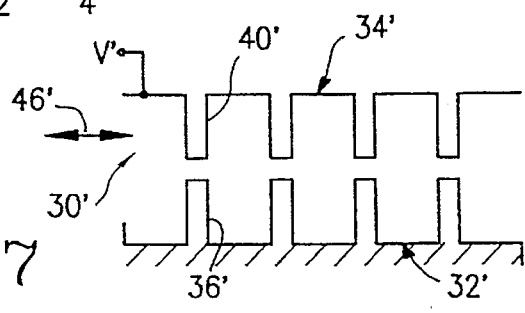
FIG. 7 is a diagrammatic illustration of a comb-type actuator used for stiffness augmentation in an electromicromechanical resonator.

The basic structure of the electrostatic tuning actuator of the present invention is illustrated in FIGS. 6 and 7, the structure of FIG. 6 illustrating an actuator which will reduce stiffness, and the structure of FIG. 7 illustrating a structure which will augment the stiffness of the system. The device of FIG. 6 illustrates a pair of comb-type electrodes generally indicated at 30 and including a stationary set of electrodes 32 and a movable set of electrodes 34. The stationary set of electrodes 32 includes a plurality of spaced, parallel fingers 36 mounted, secured to, on or formed integrally with a stationary base or substrate 38, while the movable set of electrodes 34 includes a plurality of spaced, parallel fingers 40 mounted on, secured to, or formed integrally with a relatively movable structure 42. The fingers 36 and 40 are opposed; that is, are in a spaced, facing relationship, with their free ends being spaced apart by a gap 44 which is parallel to the direction of motion of structure 42. The gap is sufficiently wide that the stationary set of electrodes 32 will not interfere with the motion of the movable set of electrodes 34. As illustrated by the arrow 46, the direction of motion of the movable set of electrodes 34 is longitudinally along the axis 48 of the structure and perpendicular to the direction in which the fingers 36 and 40 extend.

The structure of the device of FIG. 7 is similar to that of FIG. 6, with similar components being numbered with primed numbers. The difference between the structure of FIG. 6 and that of FIG. 7 is in the nonalignment or alignment of the opposed fingers 36 and 40 or 36' and 40'. Thus, in FIG. 6, the set of electrodes 34 is located so that its fingers 40 alternate with the fingers 36 of set 32 when the actuator 30 is at rest. On the other hand, in the structure 30' of FIG. 7, the fingers 40' are aligned with the fingers 36' in the rest position.

Upon application of a selected voltage across the electrodes 36 and 40 in the device of FIG. 6, fringing electrostatic fields are produced around the free ends of the electrodes 36 and 40, with the fields extending across the gap 44 between the ends of the opposed electrodes. When in the rest, or neutral, position illustrated in FIG. 6, the movable electrode set 34 experiences no net force upon the application of a voltage V and remains in the offset, or alternating position shown. If a mechanical force applied in the direction of arrow 46 deflects the electrode set 34 to the left or to the right out of its rest position, a net force of attraction will be produced by the electrostatic field between electrodes 40 and their respective opposed electrodes 36, which will tend to pull the movable structure 34 further to the left (or further to the right) and thus will continue or aid the motion introduced by the mechanical force. If the mechanical motion of electrode set 34 is considered to be the equivalent of a spring-mass force, the electrostatic force applied by the voltage V may be considered to be the equivalent of a negative spring force which is applied to the system to reduce the overall system stiffness.

In the device of FIG. 7, on the other hand, the application of a voltage V' between the opposed electrodes when the device produces an electrostatic fringing field between opposed electrodes, as described above with respect to FIG. 6, but once again no net force is applied to the balanced arrangement illustrated. However, if the electrode structure 34' is moved to the left or to the right as illustrated by arrow 46', the electrostatic fringing field tends to pull the movable electrode back to its original aligned position. This behavior is equivalent to a positive spring which would tend to stiffen the structure. The force applied by the electrostatic field is linear over a small range of displacement, for example about 1 micrometer, which is more than adequate for micromechanical applications.

Figure 8:
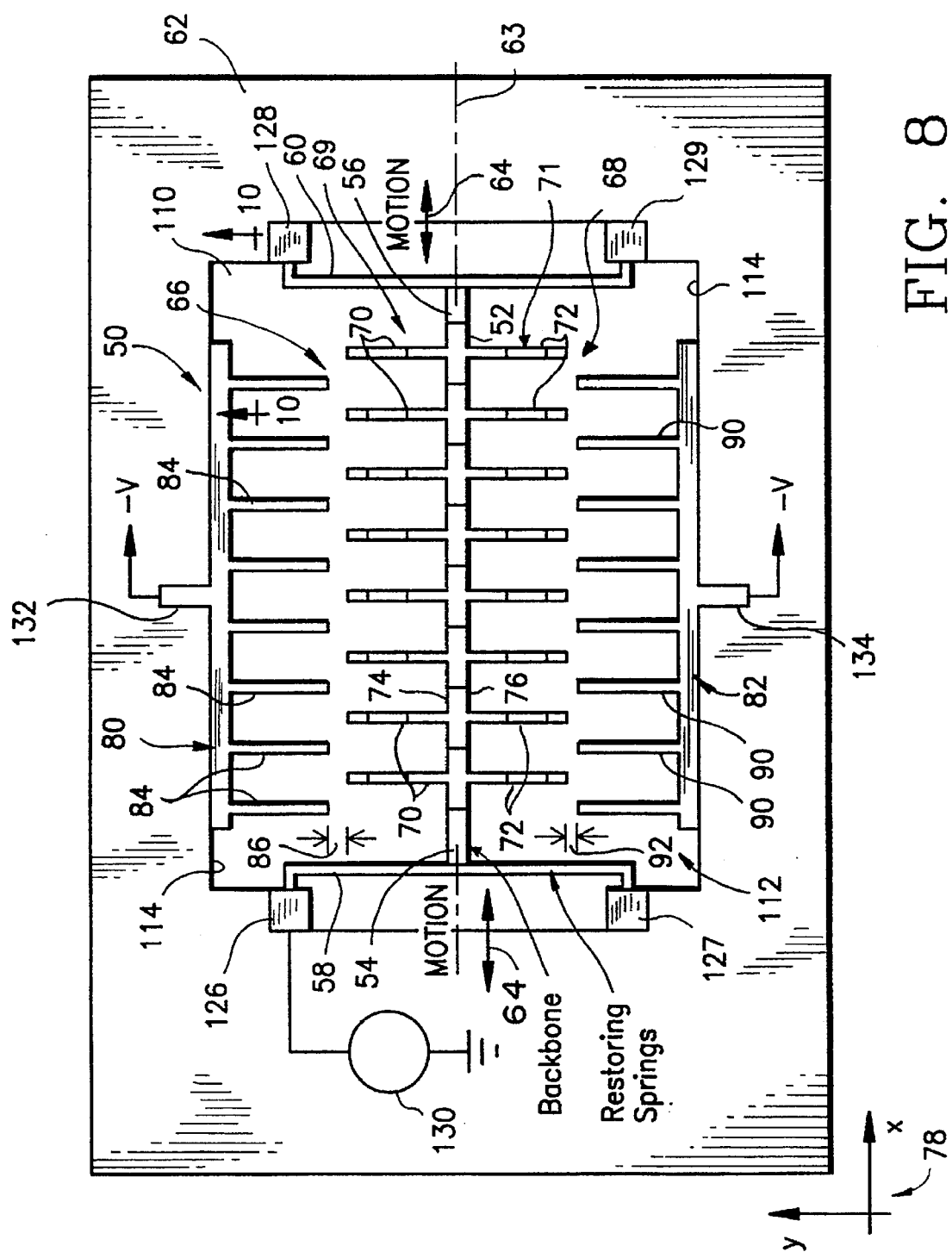
FIG. 8 is a diagrammatic top plan view of a tunable electromicromechanical resonator in accordance with the invention, utilizing two parallel electrostatic tuning actuators.
Figure 9:
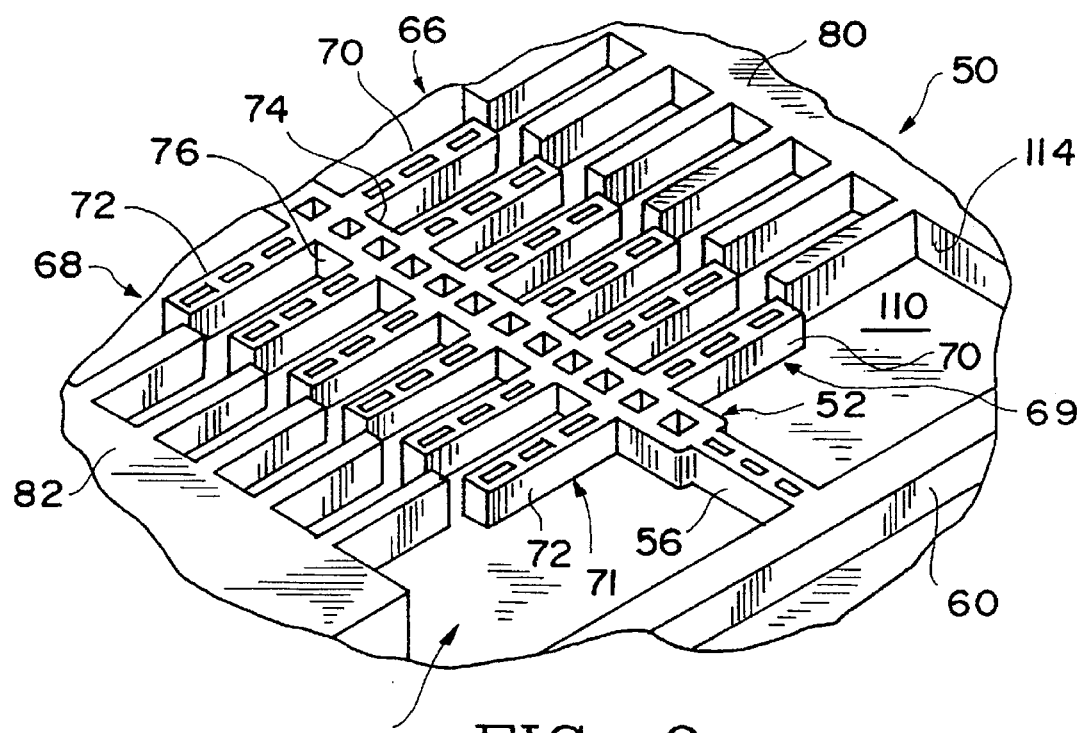
FIG. 9 is an enlarged partial perspective view of the resonator of FIG. 8.

The principles described with respect to FIGS. 6 and 7 are further illustrated in a resonator device 50 shown in top plan view in FIG. 8 and in a partial perspective view in FIG. 9. As there illustrated, the resonator consists of an elongated, movable beam 52 mounted at its ends 54 and 56 to corresponding support arms 58 and 60. These support arms extend laterally from the respective ends 54 and 56 and are connected at their outermost ends to a fixed base, which may be a substrate 62. The beam 52 is supported for with respect to base 62 motion along its longitudinal axis 63 in the direction of arrows 64, with support arms 58 and 60 being secured to hold the beam 52 in place and to constrain it to desired axial path. The support arms 58 and 60 have a high aspect ratio so they are flexible in the x-y plane in which beam 52 lies, and urge the beam 52 toward a neutral rest position when no external force is applied to the beam, to thereby serve as restoring springs for the device. The beam 52 and spring arm 58 and 60 are a micromechanical structure preferably having micron-scale dimensions. The beam 52 is also fabricated to have a high aspect ratio; i.e., with a height of 10–20μ and a width of about 0.5–3μ to provide substantial rigidity in the vertical direction. As illustrated in FIG. 9, the beam may be fabricated in a box configuration for rigidity, to enable it to withstand axial forces which produce beam motion with respect to the substrate. The movable structure has a natural resonant frequency, which is a function of its mass and of the flexibility of the spring arms, when a driving force is applied.

The resonant frequency of the resonator 50 is tuned, in accordance with the present invention, by a pair of electrostatic actuators 66 and of the comb electrode type described with respect to FIGS. 6 and 7. Each pair of actuators includes a first set of movable electrodes mounted on, and preferably integral with, the movable structure of the resonator, and a second, opposed, set of stationary electrodes mounted on, and preferably integral with, the stationary base, or substrate 62. Thus the beam 52 carries a first set 69 of laterally extending finger electrodes 70 and a second set 71 of laterally extending electrodes 72 on opposite sides of beam 52, with fingers 70 in spaced parallel arrangement along one side 74 of the beam and fingers 72 in spaced, parallel relationship along the other side 76 of beam 52. The fingers are preferably perpendicular to the axis 63 of the beam, are aligned with each other on opposite sides of the beam, and are coplanar in the x-y plane 78 of the resonator. If desired, the finger electrodes may be fabricated in the box configuration illustrated in FIG. 9 for rigidity.

Mounted on substrate 62 are two sets of stationary electrodes 80 and 82, set 80 cooperating with electrode set 70 to form actuator 66, and set 82 cooperating with electrode set 72 to form actuator 68. The electrode set 80 includes a plurality of spaced, parallel electrode fingers 84 which extend toward corresponding fingers 70 on beam 52. Electrodes 84 are parallel to electrodes 70 and are nonoverlapping; i.e., they have their free ends spaced from the corresponding free ends of electrodes 70 by a gap 86 which is parallel to axis 63 and which has a width which is sufficient to permit axial motion of the beam 52 without the free ends of the electrodes 70 contacting the opposed free ends of the electrodes 84. The gap is sufficiently small to produce a fringing field between the opposed electrodes upon the application of a bias voltage between electrode set 80 and its corresponding electrode set 69, and between electrode set 82 and its corresponding set 71.

In the embodiment of FIG. 8, the fingers 84 of electrode set 80 are offset from the opposed set 69 of fingers 70 in actuator 69, and are spaced equally from each other in the manner described with respect to FIG. 6. Similarly, the electrodes of set 82 are offset from those of set 71 in actuator 68. It will be apparent, however, that by shifting the location of the fixed electrodes during fabrication, or alternatively by shifting the location of the movable fingers on beam 52, the opposed electrodes can be aligned in the manner illustrated in FIG. 7.

As illustrated, gap 86 extends the length of the opposed electrode sets 69 and 80 and is generally parallel to the axis 63 of beam 52. In similar manner, the set 82 of electrodes includes a plurality of spaced, parallel electrode fingers 90, the free ends of which are spaced from the free ends of corresponding electrodes 72 in the electrode set 71, these electrodes being spaced apart by a gap having a width 92 and this being nonoverlapping. The sets 71 and 82 of electrodes 72 and 90 are similar to the sets 69 and 80 discussed above, with electrodes 90 being offset from electrodes 72 and being aligned with electrodes 84 so that the actuators 66 and 68 are symmetrical with respect to the axis 63.

A bias voltage applied between adjacent electrodes 70 and 84 and between adjacent electrodes 72 and 90 can be used to control the relative motion of the beam 52 with respect to the stationary substrate 62 to thereby tune the resonant frequency of the mechanical system including beam 52 and support arms 58 and 60. A mechanical force may be applied to the beam 52 to initiate oscillatory motion of the beam, which motion can be supplied by a drive actuator, as will be described hereinbelow, and the voltage applied to the actuators 69 and 71 is used to adjust the resonant frequency of the system. The symmetry of the actuators and their finger electrodes insures that no net force in the x-y plane is applied to the beam by the bias voltage when the system is at rest.

The micromechanical device illustrated in FIGS. 8 and 9 preferably is fabricated in accordance with the SCREAM-I process described in the above-mentioned Ser. No. 08/312, 797, which produces the released beam structure 52 with its lateral electrodes 70 and 72 integrally formed therewith and movable therewith. The beam structure is supported above the floor 110 of a cavity 112 which is formed in the substrate 62 during the fabrication process by the trenches which define the beam structure 52, the electrodes 70 and 72, the support arms 58 and 60, and the stationary electrodes 84 and 90. The electrodes 84 and 90 preferably are in the form of cantilevered beams extending from a side wall 114 of the cavity 112.

Figure 10:
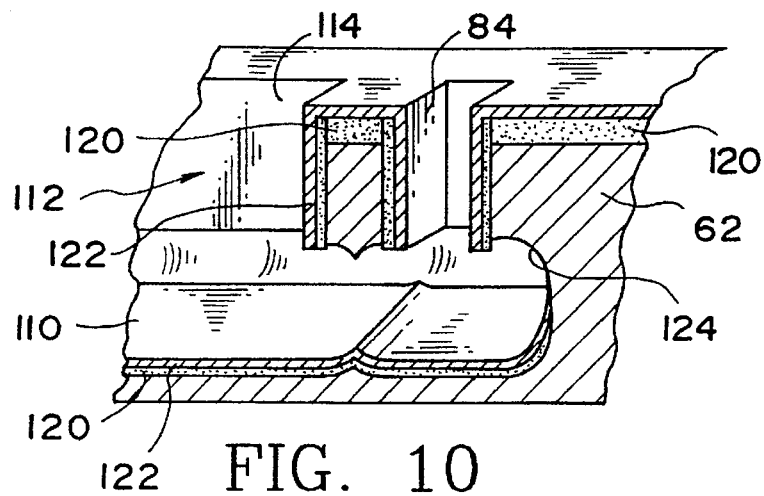
FIG. 10 is a partial cross-sectional view taken along lines 10—10 of the resonator of FIG. 8.

As illustrated in greater detail in FIG. 10, electrode 84 extends in cantilever fashion from sidewall 114 and extends above the floor 110 of cavity 112. The interior of the beam 84 is the same material of the substrate 62, preferably single crystal silicon, with the beam being covered by a dielectric layer 120 and by a metal layer 122 such as aluminum. During the undercutting step used in the SCREAM-I process to release the beams and the electrodes, the side walls are also undercut to produce a concavity 124. The aluminum layer 122 also is provided on the floor 110 of the cavity, with the suspended beam and the undercut region 124 at the edge of the cavity providing electrical isolation between various regions of the metal layer.

The metal layer 122 on the surface of substrate 62 may be patterned to provide electrical contact regions such as those illustrated at 126 through 129 in FIG. 8 for connection of the electrodes 70 and 72 to a voltage source 130. In similar manner, connector pads 132 and 134 may be provided on the surface of substrate 62 for providing electrical connections between the electrode sets 80 and 82, respectively, to electrical ground, or to a negative voltage source (−V), whereby a suitable bias voltage may be applied across actuators 66 and 68.

Figure 11:
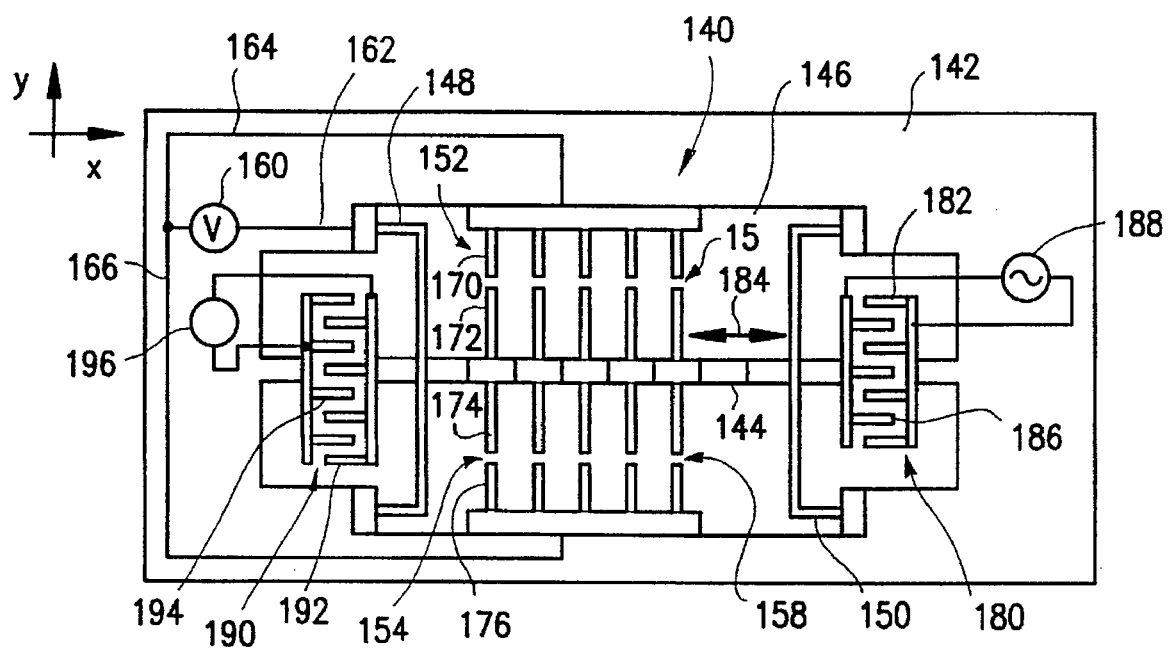
FIG. 11 is a diagrammatic top plan view of the resonator of FIG. 8 incorporating an excitation electrode and a sensing electrode.

A modification of the resonator of FIGS. 8 and 9 is illustrated in FIG. 11, to which reference is now made. In this figure, a resonator 140 is fabricated in a substrate 142 of single crystal silicon, in the manner described with respect to FIG. 8. The resonator includes a movable beam 144 fabricated within a cavity 146 in the substrate, the beam 144 being released from the substrate and mounted for motion with respect to the substrate on support arms 148 and 150 located at opposite ends of the beam. Electrostatic actuators 152 and 154 are provided on opposite sides of beam 144, again as described with respect to FIGS. 8 and 9, with the actuators having respective sets of opposed electrodes spaced apart by gaps 156 and 158. A bias voltage 160 may be applied across actuators 152 and 154 byway of connector 162 electrically connected to the movable beam 144 and connectors 164 and 166 connected to the stationary electrodes of actuators 152 and 154, for example.

The opposed electrodes 170 and 172 of actuator 152 and the opposed electrodes 174 and 176 of actuator 154 are aligned in the manner described above with respect to FIG. 7 in the illustrated embodiment, so that the applied voltage produces an electrostatic field between adjacent opposed electrodes which augments the stiffness of the beam 144, which is the resonant structure for this device. If desired, the electrodes can be offset, as in FIG. 8.

Mechanical motion may be applied to the beam 144, in the illustrated embodiment, by an excitation driver 180 which consists of two sets of opposed, interleaved, comb-type capacitor electrodes. Thus, the excitation driver includes a set of stationary electrodes 182 secured in cantilever fashion to the substrate 142 but extending outwardly from the substrate in a direction parallel to the direction of motion of beam 144, indicated by arrows 184. Opposed movable electrodes 186 are mounted on beam 184 for motion therewith, with the electrodes 182 and 186 being connected across a voltage supply such as that illustrated at 188. Application of an alternating drive voltage across actuator 180 produces longitudinal, or axial motion in the beam 144 at a frequency close to the natural resonant frequency of the beam as determined by the mass of the beam and its electrodes and the stiffness of the support arms 148 and 150. The application of a voltage across the actuators 152 and 154, in the manner described above, will tune the resonance of the beam 144, increasing or decreasing the effective spring constant of the system, in the manner described above.

Motion of the beam 144 may be sensed by means of a sensor capacitor 190 having movable electrodes 192 mounted on beam 144 for motion therewith and having stationary electrodes 194 mounted fixedly on the substrate 142. The actuator 190 consists of two comb-type electrode structures having their respective electrode fingers 192 and 194 interleaved whereby motion of beam 144, and thus of electrodes 192 with respect to electrodes 194, changes the capacitance between the adjacent electrodes. This change in capacitance can be detected by a suitable sensor 196 to provide an output signal which is a measure of the motion of beam 144, with the frequency of the output signal being the resonant frequency of the system as tuned by actuators 152 and 154. The mechanical structure may thus act as a mechanical filter between the input signal 188 and the output 196.

Figure 12:
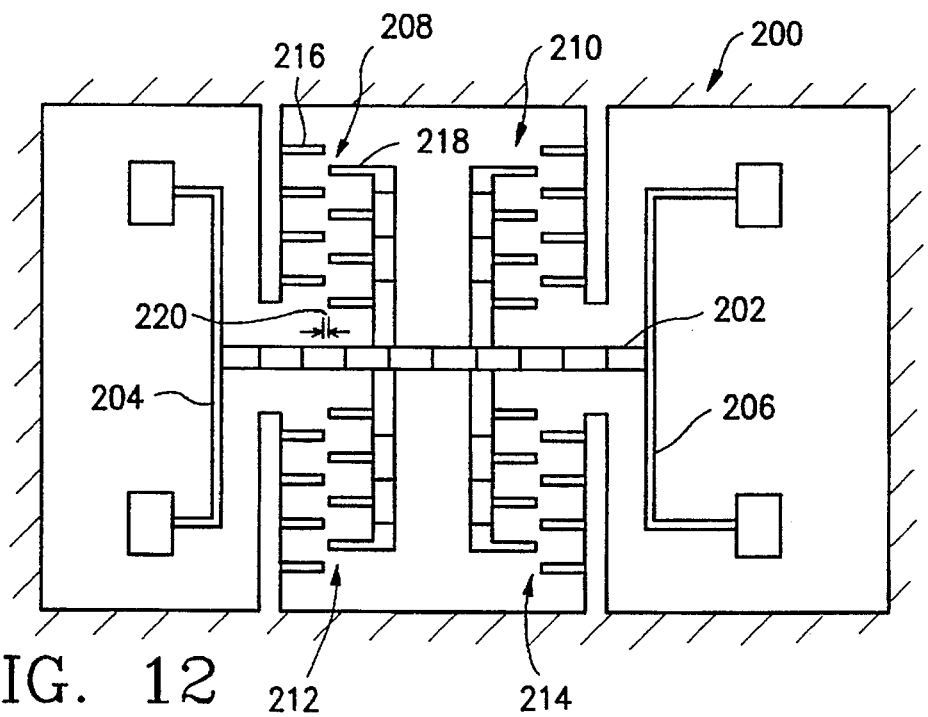
FIG. 12 is a diagrammatic top plan view of a tunable resonator utilizing perpendicular electrostatic tuning actuators.

In the foregoing structures, the motion of the movable beam and its electrodes are in a direction perpendicular to the width of the gap between opposed sets of electrodes in each actuator and the actuators are symmetrical along lines parallel to the direction of motion. Accordingly, the tuning actuators do not produce a net force in either the x or y directions when centered, and this parallel relationship is preferred. Nevertheless, favorable results are achievable with other actuator geometries. Thus, for example, as illustrated diagrammatically in FIG. 12, a resonator 200 includes a movable microelectromechanical beam 202 mounted at its opposite ends to laterally extending support arms 204 and 206 which serve as spring arms to confine the motion of the beam in a direction along its axis, as previously described. In this case, however, four tuning actuators are provided as indicated at 208, 210, 212, and 214. All of these actuators are comb-type structures having opposed electrodes, such as the electrode 216 and 218 of actuator 208 which are separated by a gap 220 which extends in a direction perpendicular to the axis of beam 202.

Figure 13:
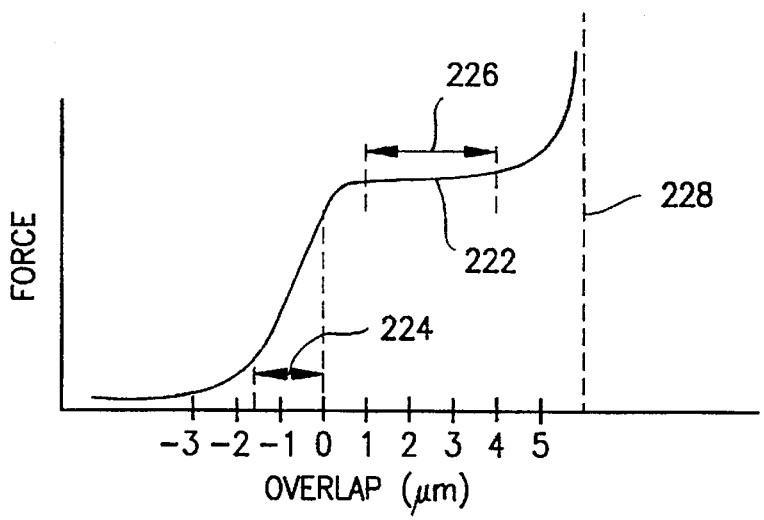
FIG. 13 illustrates a force vs. deflection curve for a comb actuator structure of the type illustrated in FIG. 12.

Application of a voltage across the two sets of opposed electrodes 216 and 218 produces an electrostatic field in the region where the fingers come close to overlapping. A force versus deflection plot for this actuation region is illustrated by curve 222 in FIG. 13, where the tuning region is indicated at 224 and the region of typical use is indicated at 226. The matching halves of the actuator of FIG. 12 will collide if the deflection reaches of the amount indicated by dotted line 228. The voltages applied across the sets of electrodes in each of the actuators are used to reduce the stiffness of the resonator structure 200.

Figure 14:
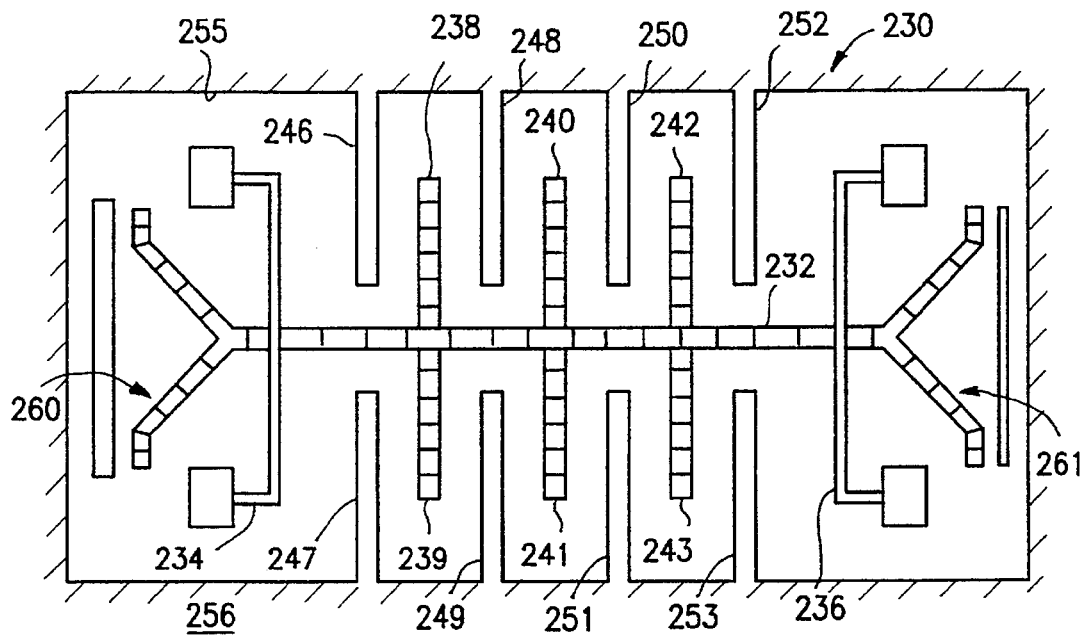
FIG. 14 is a diagrammatic top plan view of a tunable resonator utilizing symmetric parallel plate actuators.

FIG. 14 illustrates another resonator structure 230 wherein movable beam 232 is supported by lateral arms 234 and 236, as described above. Symmetric pairs of parallel plates on each side of the structure are provided in this embodiment to electrostatically reduce stiffness. Thus, laterally extending electrode plates 238 through 243 are mounted on arm 232 for motion therewith. The ends of these electrode plates extend between adjacent fixed electrode plates 246 through 253. The fixed plates are cantilever beams extending from the sidewall 255 of the surrounding substrate 256, as discussed above with respect to FIGS. 8 and 9. By applying a first voltage to the plates 246 through 253 and a second voltage to the plates 238 through 243, the voltages on each side of the movable plates nullify each other and the beam 232 will not experience a net force unless it is displaced from equilibrium. If it is displaced, the force is proportional to the displacement over a small range of displacements on the order of tenths of a micron. These voltages reduce the system's stiffness. If the displacement exceeds a critical value, the electrodes will cause the movable structure to move too far, causing the movable electrodes to strike the stationary electrodes. However, the positive aspect of this structure is that it is very efficient in terms of space.

The structure of FIG. 14 is a highly effective acceleration limit switch, for acceleration in either axial direction will cause the movable structure 232 with its electrodes 238–243 to move toward fixed electrodes 246–253. If the movable and fixed electrodes get too close, the movable electrodes will be drawn toward the fixed electrodes by the applied bias voltage and can then be used to activate a switch such as one of the microswitches 260, 261 illustrated in FIG. 14. The magnitude of the voltage applied across the electrodes determines the magnitude of the acceleration necessary to activate the switch.

It will be understood that the number of electrodes shown in each of the drawings is for purposes of illustration only. It is preferred that large numbers of electrodes be used in each actuator to provide the required sensitivity. Further, dense arrays of actuators can be constructed with a large linear range of operation with the opposed electrodes being fabricated either in or out of alignment to provide stiffness augmentation or reduction, respectively.

The governing equation of motion for a resonator with all the mechanical system components on the left hand side, and all the electrostatic actuator components on the right hand side is as follows:

$$m\ddot{x} + c\dot{x} + kx = F(x, V)  \quad \text{(Eq. 3)}$$

The forcing function, $F(x(t),V'(t))$, with time t, displacement x, and voltage V, consists of an excitation force and a passive tuning actuator force, each supplied by a separate actuator:

$$F(x, V_e, V) = F_{excite}(x, V_e) + F_{tuning}(x, V)  \quad \text{(Eq. 4)}$$

By proper design of a tuning actuator, it is possible to obtain a passive tuning force, $F_{tuning}$, that is proportional to the By proper design of a tuning actuator, it is possible to obtain a displacement, x, where the constant of proportionality is designated as $-k_{elec}$. Through a simple rearrangement of terms we arrive at the following equation:

$$m\ddot{x} + c\dot{x} + (k_{mech} + k_{elec})x = F_{excite}(x, V_e)  \quad \text{(Eq. 5)}$$

which can be used to determine the effective resonant frequency of the electromechanical system.

$$\omega = \sqrt{\frac{K_{mech} + k^0_{elec}V^2}{m}}  \quad \text{(Eq. 6)}$$

where the relation $k_{elec} = K^0_{elec}V^2$, is used to explicitly show the voltage dependence of the actuator's forcing function.

Figure 15:
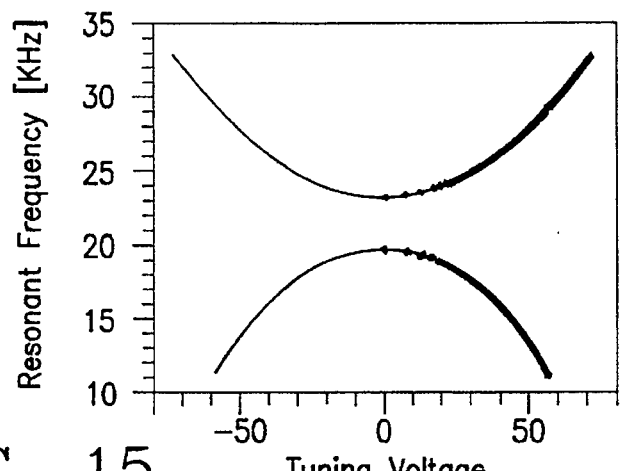
FIG. 15 illustrates the relationship of resonant frequency to changes in tuning voltage for the actuator of FIG. 11, based on experimental data.

Experiments were carried out in a scanning electron microscope to test the operation of a resonator such as that illustrated in FIGS. 11. In that device, the bias voltage supplied to the tuning actuator was varied over a range from 0 to 75 volts, and at each step an excitation voltage of approximately 1.5 volts was applied to a driver such as drive 180 in FIG. 11, with the voltage being swept over a suitable range of frequencies. Resonance of the beam; for example, beam 144 of FIG. 11, was determined by selecting the frequency at which the vibration amplitude was a maximum. Care was taken to ensure that the amplitude of vibration was low enough to avoid the frequency versus amplitude hysteresis that is associated with nonlinear stiffness components. FIG. 15 illustrates the results for two tunable oscillators which only differ in their tuning actuator geometries. Mechanically, both oscillators were designed to have identical stiffness and mass. However, in the absence of applied potential, the difference between the resonant frequencies was on the order of 10%. As implied by equation 6, plotting the square of the natural frequency as a function of the voltage squared would ideally yield a straight line.

Figure 16:
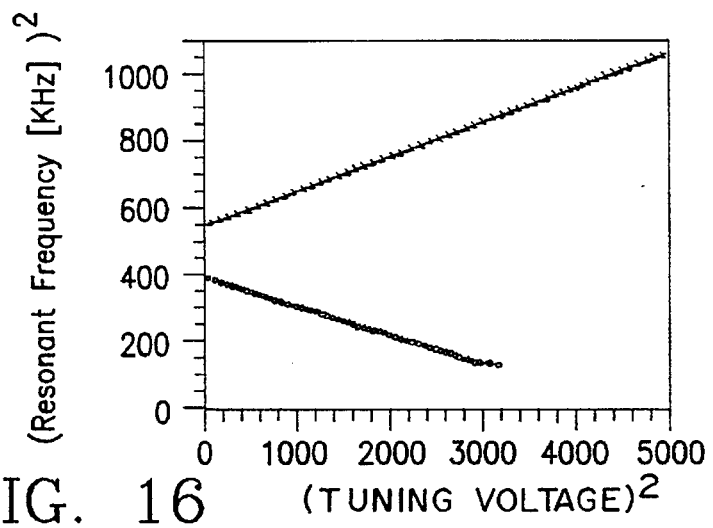
FIG. 16 is a replotting of the data from FIG. 15 to illustrate the linearity of the relationship between resonant frequency squared vs. tuning voltage squared.

FIG. 16, which is a replot of the data shown in FIG. 6, verifies this prediction. Force versus deflection plots for infringing field comb structures were also calculated using a CAD package called "High Aspect Ratio Simulation Package." These plots were calculated for stiffness increasing and stiffness decreasing actuators, and the calculated results are compared to those determined from the experimental data in the following: 1:

TABLE 1

| [N/(mV2)] | Reduction | Augmentation |
|---|---|---|
| Simulation | 9.8 × 10–4 | –9.0 × 10–4 |
| Experiment | 8.3 × 10–4 | –1.20 × 10–3 |
| Comparison | 18% | 10% |

The difference between the simulation and the experimental results is primarily attributed to the sensitivity of the electrostatic actuator to the gap, to the assumptions inherent in the calculations, and to the uncertainty in the total mass of the structure.

For simplicity, the tunable resonator has been considered to be a simple spring mass system where the nonlinearities in a mechanical system and the passive tuning actuators were ignored. However, a careful review of FIG. 5 reveals that the two linear regions "a" and "b" are of different lengths. This means that they have a different cubic term $k_3$ in the equation:

$$F = k_1 x + k_3 x^3 + \ldots \qquad (\text{Eq. 7})$$

By applying a voltage to a stiffness augmentation actuator or a stiffness reduction actuator, the linear term is unaffected, while the cubic term is tuned. In most mechanical systems, a positive cubic restoring force exists, and in many cases this is undesirable. Using the tuning actuator of the present invention, it is possible to reduce the cubic term and even cause it to become negative. More specifically, the stiffness reduction and stiffness increasing actuators will contribute negative and positive cubic stiffness contributions, respectively. A theoretical set of stiffness values for the stiffness reduction actuator is shown in Table 2 and their respective places in the governing equation of motion is illustrated in Equation 8:

$$m\ddot{\chi} + c\dot{\chi} + (k_{mech} + k_{elec}{}^0 V^2)\chi + (\eta_{mech} + \eta_{elec}{}^0 V^2)\chi^3 = F_{excite}(\chi, V_e) \qquad (\text{Eq. 8})$$

TABLE 2

| | |
|---|---|
| $k_{mech}$ | 2.6 N/m |
| $\eta_{mech}$ | 9.2 10$^{11}$ N/m$^3$ |
| $k_{elec}{}^0$ | 9.8 10$^{-4}$ N/(mV |
| $\eta_{elec}{}^0$ | 1.2 10$^8$ N/m(m$^3$V$^2$) |
| m | 2.4 10$^{-10}$ kg |
| c | 200 s$^{-1}$ |

Figure 17:
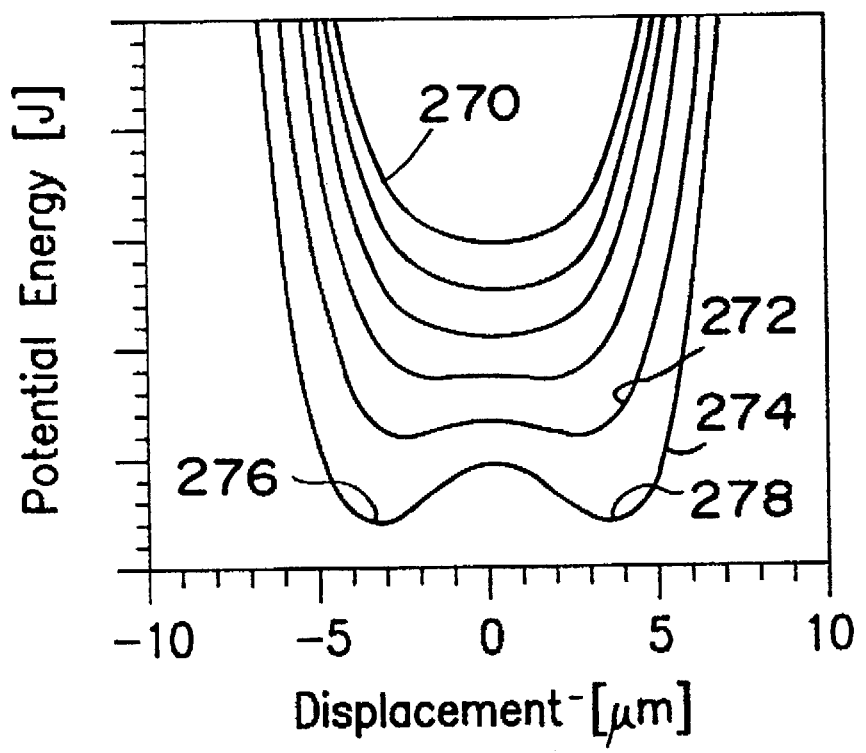
FIG. 17 is a series of curves illustrating system potential energy vs. displacement for different bias voltages.

Potential energy plots of the electromechanical system described hereinabove provide a visual tool in describing the behavior of the system. FIG. 17 is a potential energy diagram of the frequency reduction actuator shown in FIG. 11. Under zero bias voltage across the actuator electrodes, the potential energy plot of curve 270 exhibits a single "well" containing quadratic and quartic terms from the mechanical system. As the bias voltage is increased, the concavity of the well is decreased. This results in the frequency reduction tuning described above. As the bias voltage is increased further, the concavity of the well eventually changes sign, as illustrated by curves 272 and 274, and the single equilibrium point bifurcates into a pair of equilibria 276 and 278. In this range of bias voltages, the system has a double-well potential structure which locally resembles that of a Duffing Oscillator. Thus, by reducing the stiffness of the structure, the net stiffness of the system becomes negative and the original equilibrium point becomes unstable so that the structure will deflect to the left or to the right into one of the two equilibrium points 276 or 278. When a system with a double-well potential is excited by an external force, the system can display a seemingly chaotic or random behavior.

From the foregoing, it will be apparent that tuning actuators provide a mechanism for electromechanically altering the stiffness and thus the resonant frequency of a resonator. This technology can easily be included in an accelerometer to compensate for variations that occur in the fabrication process. The sensitivity of the accelerometer is tunable to a particular value, or the resonant frequency can be shifted to achieve a desired frequency response range. In the area of nonlinear oscillators, the resonator behavior is not limited to that of a Duffing Oscillator, for by sinusoidally varying the bias voltage, the oscillator can be provided with a periodic stiffness.

Thus, the present invention describes actuators which tune the resonant frequency of a micromechanical device to provide either a positive or a negative spring force which varies in accordance with the square of the applied voltage. In experiments, the resonance frequency has been tuned from 7.7% to 146% of the original, or natural value of the mechanical system, with the limits of the tuning being the electromechanical stability of the device and the dielectric breakdown strengths between the electrode metalization and the substrate. By applying a bias voltage greater than a certain critical bias voltage, a resonator with a stiffness reduction actuator exhibits a double-well potential. This technology can be used to tune the performance of resonant sensors, electromechanical filters, accelerometers, nonlinear oscillators, and the like.

Although the invention has been described in terms of preferred embodiments, it will be understood that the true spirit and scope of the invention is limited only by the following claims.

What is claimed is:

1. A micromechanical actuator, comprising
   a micromechanical structure having a first stationary component and a second component relatively movable with respect to said first component;
   a first set of spaced-apart, substantially parallel comb-type electrode fingers mounted on said first component;
   a second set of spaced-apart, substantially parallel comb-type electrode fingers mounted on said second component, said fingers of said first and second sets being coplanar and in opposed, nonoverlapping relationship with a gap therebetween; and
   a bias voltage source connected across said first and second sets of electrodes to produce an electrostatic field therebetween.

2. The actuator of claim 1, wherein said voltage source is variable.

3. The actuator of claim 2, wherein said second component is movable along an axis, and wherein said gap is parallel to said axis.

4. The actuator of claim 3, wherein said electrode fingers of said first set are offset from said electrode fingers of said second set.

5. The actuator of claim 3, wherein said electrode fingers of said first set are aligned with said electrode fingers of said second set.

6. The actuator of claim 3, wherein said second component is a movable beam mounted within a cavity in a single crystal silicon substrate, said first set of electrode fingers being integral with said substrate and said second set of electrode fingers being integral with said movable beam.

7. The actuator of claim 6, wherein said relatively movable component has a natural mechanical stiffness, said voltage source being variable to adjust said stiffness.

8. The actuator of claim 6, wherein said beam is mounted for motion by at least one spring arms secured to said substrate, said movable beam, spring arm and second set of electrodes being movable at a natural frequency of resonance, said voltage source being adjustable to adjust said frequency of resonance.

9. The actuator of claim 8, wherein said electrode fingers of said first set are aligned with said electrode fingers of said second set, said voltage source being variable to increase said resonant frequency.

10. The actuator of claim 8, wherein said electrode fingers of said first set are offset from said electrode fingers of said second set, said voltage source being variable to reduce said resonant frequency.

11. The actuator of claim 10, wherein said voltage source provides a sufficiently high bias to said actuator to produce a double well potential.

12. An electromicromechanical resonator, comprising:

a substrate;

a micromechanical beam structure having micron-scale dimensions movable with respect to said substrate along an axis;

spring arms connected between said beam and said substrate, said spring arms and movable beam having a rest position and having a natural resonant frequency;

first and second electrostatic actuators, each actuator having a first set of finger electrodes mounted on said beam, and each actuator having a second set of finger electrodes mounted on said substrate, said first and second sets of electrodes each actuator being opposed and non-overlapping to provide a gap therebetween; and an adjustable bias voltage connected across each set of electrodes to adjust said resonant frequency.

13. The resonator of claim 12, wherein the electrodes of said first set of finger electrodes for each actuator are aligned with corresponding electrodes of the second set of finger electrodes.

14. The resonator of claim 12, wherein the electrodes of said first set of finger electrodes for each actuator are offset from corresponding electrodes of the second set of finger electrodes.

15. The resonator of claim 12, wherein said first and second actuators are coplanar and symmetrical, whereby said actuators provide no net force on said beam in the rest position.

16. The resonator of claim 15, further including drive means for moving said beam at a frequency at or near said natural frequency.

17. The resonator of claim 12, wherein said gap is parallel to said axis.

18. The resonator of claim 12, wherein said gap is perpendicular to said axis.

* * * * *